(12) United States Patent
Hanna et al.

(10) Patent No.: US 12,538,458 B2
(45) Date of Patent: Jan. 27, 2026

(54) COLD PLATE SYSTEM INTERFACE FOR LIQUID COOLED DEVICES

(71) Applicant: Intel Corporation, Santa Clara, CA (US)

(72) Inventors: Timothy Glen Hanna, Tigard, OR (US); Suchismita Sarangi, Hillsboro, OR (US); Carl D. Williams, Hillsboro, OR (US); Jordan Johnson, Albany, OR (US); Juan G. Cevallos Palomeque, Portland, OR (US); Mark E. Sprenger, Tigard, OR (US); Peipei Ding, Taipei (TW); Christian Amoah-Kusi, Portland, OR (US); Sean T. Sivapalan, Portland, OR (US); Rithi S. Soeung, Hillsboro, OR (US); Curtis A. Valentine, Scappoose, OR (US)

(73) Assignee: Intel Corporation, Santa Clara, CA (US)

( * ) Notice: Subject to any disclaimer, the term of this patent is extended or adjusted under 35 U.S.C. 154(b) by 771 days.

(21) Appl. No.: 17/110,068

(22) Filed: Dec. 2, 2020

(65) Prior Publication Data
US 2021/0127529 A1    Apr. 29, 2021

(51) Int. Cl.
*H05K 7/20* (2006.01)
*H01L 23/473* (2006.01)

(52) U.S. Cl.
CPC ..... *H05K 7/20772* (2013.01); *H05K 7/20254* (2013.01); *H01L 23/473* (2013.01)

(58) Field of Classification Search
CPC ............ H05K 7/20254; H05K 7/20772; H01L 23/473
See application file for complete search history.

(56) References Cited

U.S. PATENT DOCUMENTS

| | | | | |
|---|---|---|---|---|
| 4,991,876 A | * | 2/1991 | Mulvey | .................. E03C 1/025 |
| | | | | 285/915 |
| 5,914,860 A | * | 6/1999 | Janko | .................... F28F 21/084 |
| | | | | 361/710 |

(Continued)

FOREIGN PATENT DOCUMENTS

| | | | | |
|---|---|---|---|---|
| CN | 109378021 A | * | 2/2019 | |
| EP | 1314946 A1 | * | 5/2003 | ............ F28F 9/0253 |

OTHER PUBLICATIONS

Tallis, Billy, "Intel Introduces "Ruler" Server SSD Form-Factor: SFF-TA-1002 Connector, PCIe Gen 5 Ready", Anandtech, downloaded from: https://www.anandtech.com/print/11702/intel-introduces-new-ruler-ssd-for-servers, Aug. 9, 2017, 5 pages.

*Primary Examiner* — Robert J Hoffberg
(74) *Attorney, Agent, or Firm* — Compass IP Law PC

(57) ABSTRACT

An apparatus is described. The apparatus includes a cold plate. The ruler factor cold plate is to receive heat from semiconductor chips of a electronic component that is to be plugged into an electronic system. The cold plate has at least one of: a) a linearly advancing physical interface, the linearly advancing physical interface to make physical contact with a corresponding linearly advancing physical interface of a cooling component of the electronic system, the physical contact to create a thermal path from the cold plate to the cooling component; b) first fingers on a first face of the cold plate to make spring-force thermal contact with the semiconductor chips of the electronic component and second fingers on an opposite second face of the cold plate to make spring-force thermal contact with the respective semiconductor chips of another, neighboring electronic component.

13 Claims, 15 Drawing Sheets

(56) References Cited

U.S. PATENT DOCUMENTS

| | | | | |
|---|---|---|---|---|
| 6,049,469 A * | 4/2000 | Hood, III | H05K 9/0039 | 438/122 |
| 6,088,228 A * | 7/2000 | Petersen | H05K 7/142 | 361/752 |
| 6,583,986 B1 * | 6/2003 | Storti | H05K 5/026 | 361/720 |
| 6,665,184 B2 * | 12/2003 | Akselband | H01L 23/473 | 174/15.1 |
| 7,289,331 B2 * | 10/2007 | Foster, Sr. | G06F 1/184 | 257/E23.102 |
| 7,593,221 B2 * | 9/2009 | Sheng | G11B 33/1493 | 361/818 |
| 7,911,798 B2 * | 3/2011 | Chang | H01L 23/467 | 361/709 |
| 7,965,509 B2 * | 6/2011 | Campbell | H01L 23/473 | 361/720 |
| 8,537,552 B2 * | 9/2013 | Paquette | H05K 7/20509 | 361/717 |
| 8,570,744 B2 * | 10/2013 | Rau | H01L 23/473 | 361/720 |
| 8,587,943 B2 * | 11/2013 | Barina | H01L 23/427 | 361/720 |
| 8,659,897 B2 * | 2/2014 | Meijer | G06F 1/20 | 361/721 |
| 8,767,403 B2 * | 7/2014 | Rau | G06F 1/20 | 361/721 |
| 8,913,384 B2 * | 12/2014 | David | H05K 13/00 | 361/721 |
| 9,019,704 B2 * | 4/2015 | Rubenstein | F28F 3/12 | 361/698 |
| 9,068,784 B2 * | 6/2015 | Cox | H05K 7/20318 | |
| 9,351,428 B2 * | 5/2016 | Eckberg | F16L 37/34 | |
| 9,370,122 B2 * | 6/2016 | Chainer | G06F 3/044 | |
| 9,867,315 B2 * | 1/2018 | Berk | H01L 23/473 | |
| 9,905,274 B1 * | 2/2018 | Cho | G11B 33/1426 | |
| 10,021,814 B2 * | 7/2018 | Aoki | H05K 7/2039 | |
| 10,602,640 B1 * | 3/2020 | Tsai | H05K 7/20254 | |
| 10,667,431 B1 * | 5/2020 | Lunsman | H05K 7/20254 | |
| 10,955,883 B1 * | 3/2021 | Franz | G06F 1/26 | |
| 11,240,943 B2 * | 2/2022 | Woolard | H05K 7/20927 | |
| 11,579,668 B2 * | 2/2023 | Lunsman | G06F 1/183 | |
| 11,785,742 B2 * | 10/2023 | Nadarajah | F28D 1/035 | 361/679.53 |
| 11,882,672 B2 * | 1/2024 | Chen | H05K 7/20272 | |
| 11,924,996 B2 * | 3/2024 | Zakaib | H05K 7/20272 | |
| 2007/0030646 A1 * | 2/2007 | Hsu | G11B 33/1426 | |
| 2013/0342987 A1 * | 12/2013 | Yang | H01L 23/473 | 361/679.32 |
| 2022/0053668 A1 * | 2/2022 | Ferrer Medina | G06F 1/20 | |

* cited by examiner

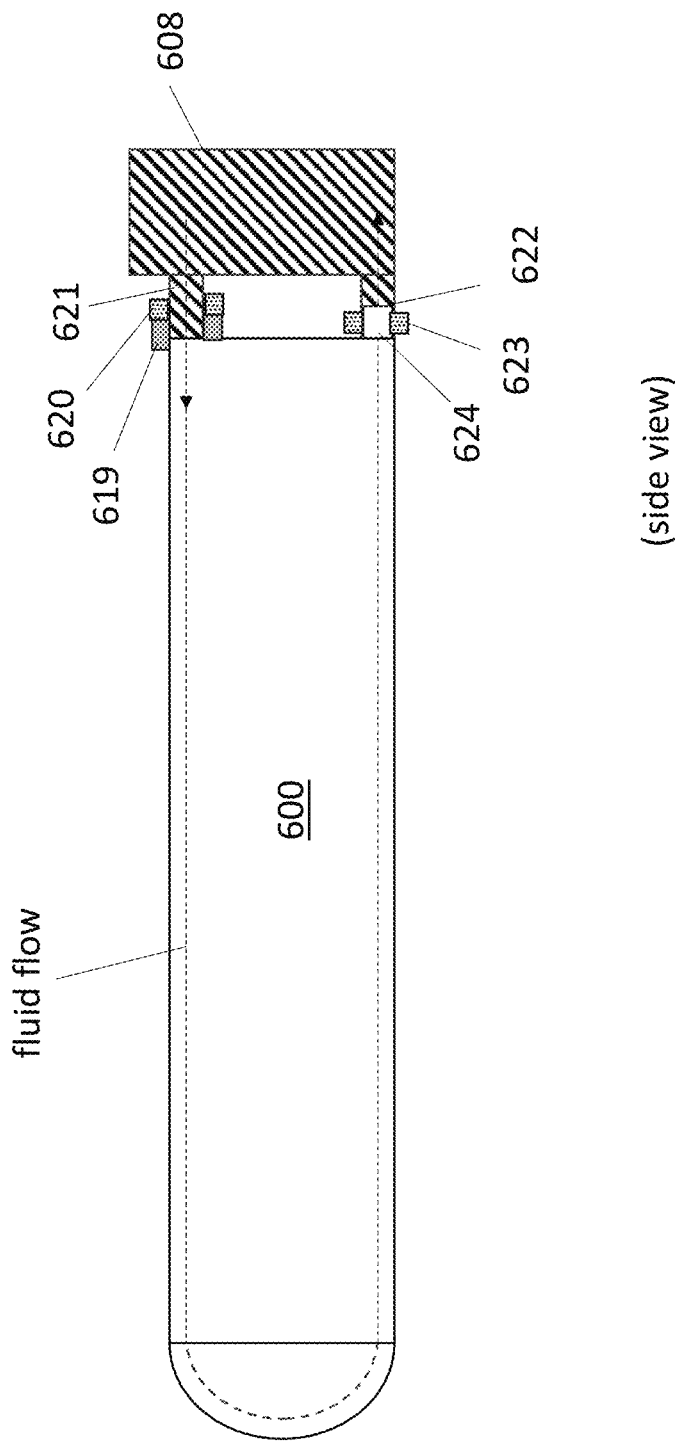
Fig. 6b (side view)

COLD PLATE SYSTEM INTERFACE FOR LIQUID COOLED DEVICES

FIELD OF INVENTION

The field of invention pertains generally to the computing sciences, and, more specifically, to a cold plate system interface for liquid cooled devices.

BACKGROUND

With the onset of cloud computing and big data, system administrators are increasingly looking for new ways to pack as much functionality into as small a space as is practicable. However, increasingly difficult component integration challenges, particularly with respect to packaging and cooling, present themselves when trying to maximize functionality and minimize space consumption.

FIGURES

A better understanding of the present invention can be obtained from the following detailed description in conjunction with the following drawings, in which:

FIG. 1 outlines the form factor of a hard disk drive (HDD);

Figure 5:
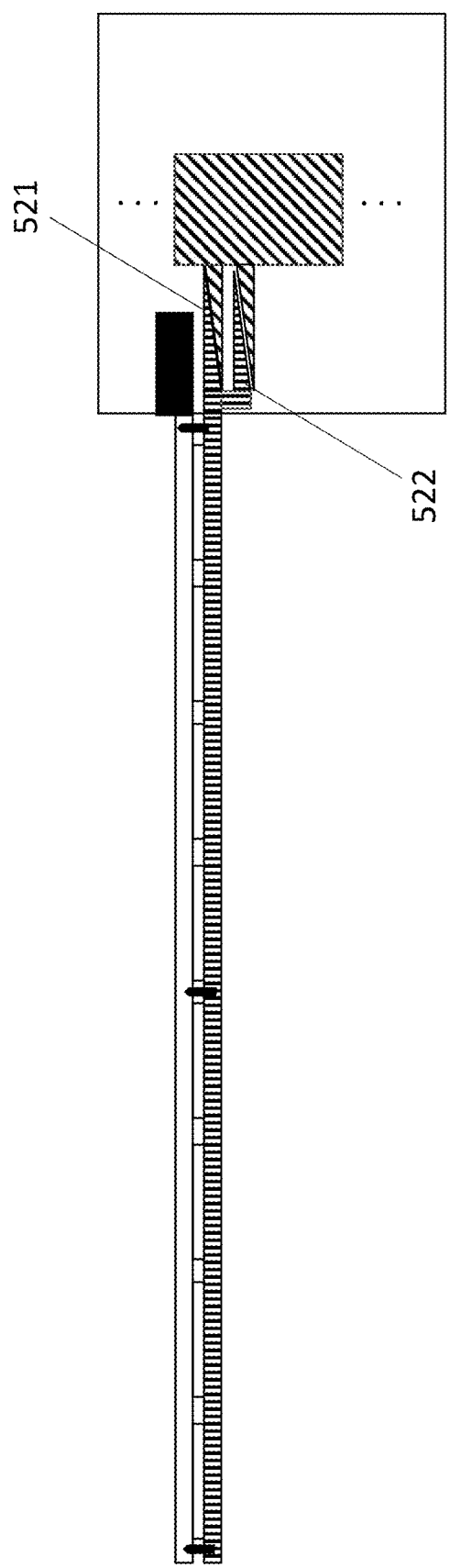
Figure 7:
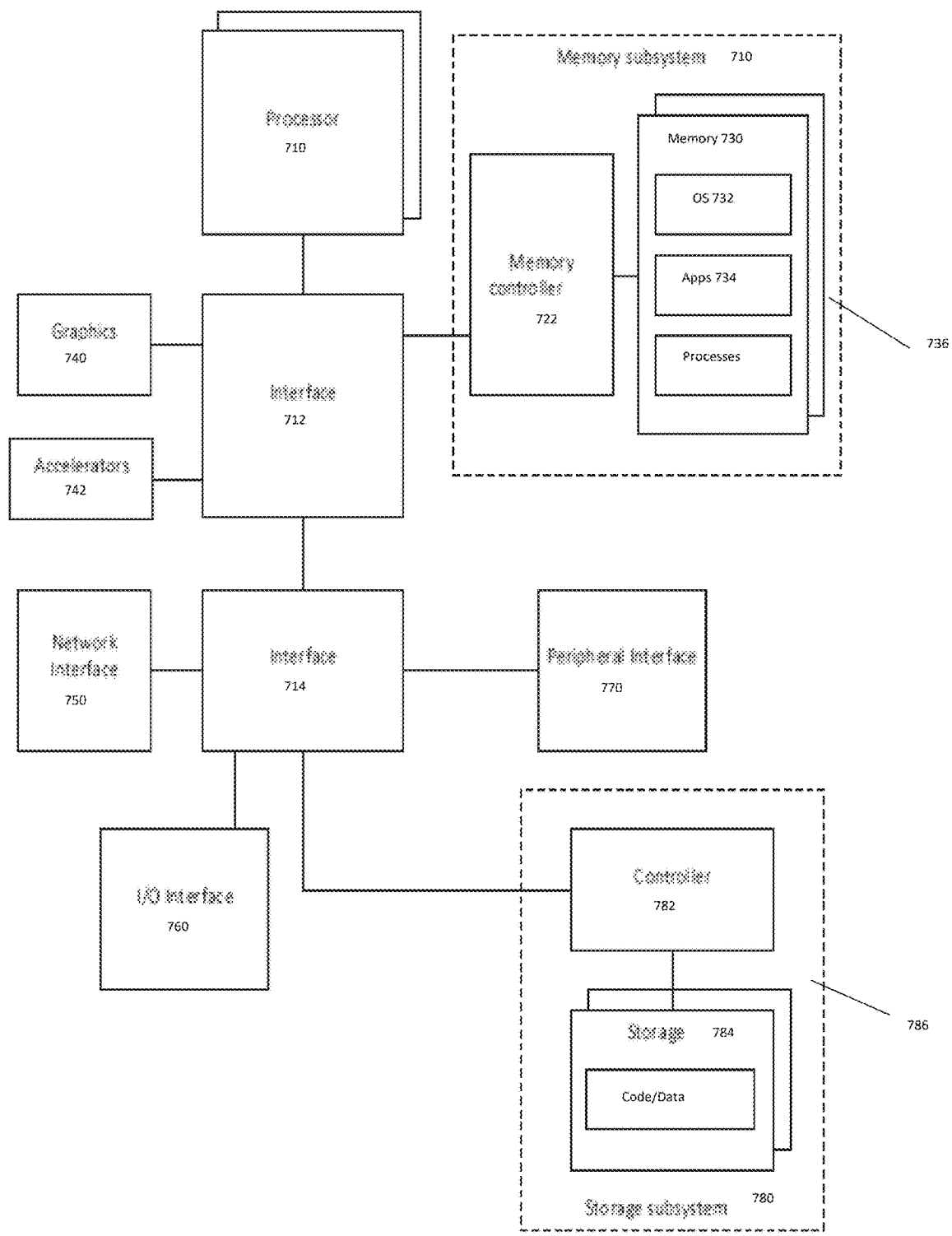
Figure 8:
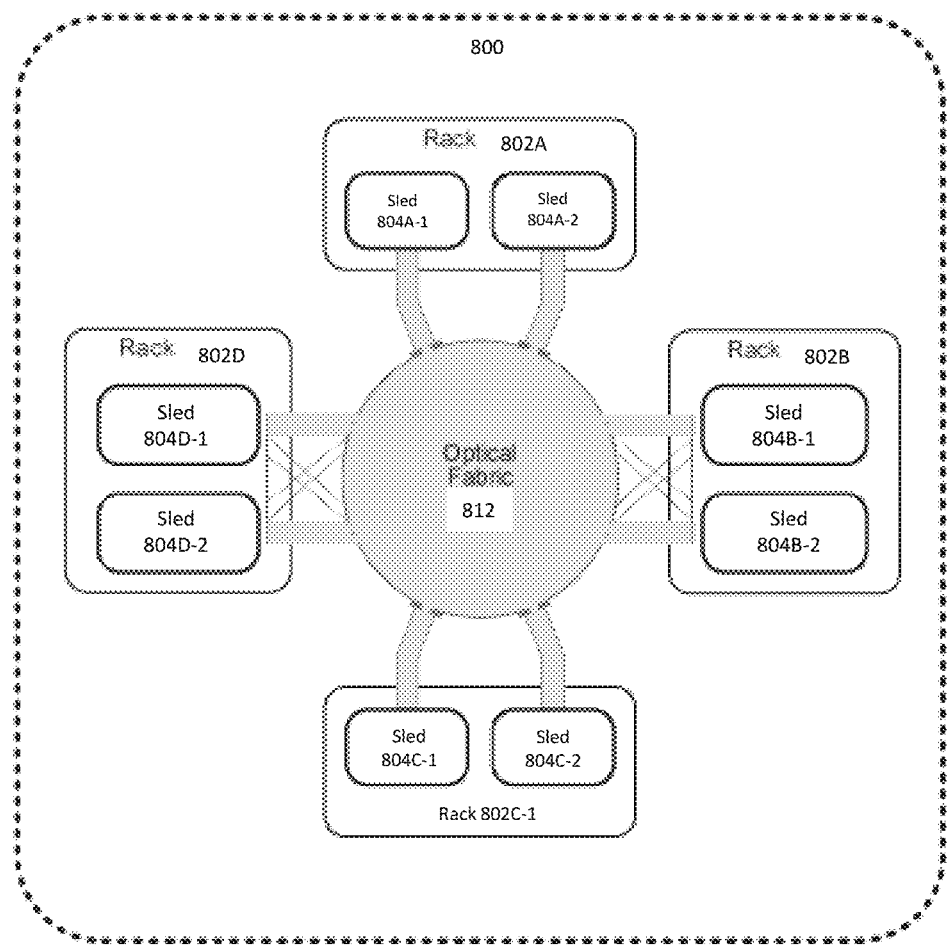
Figure 9:
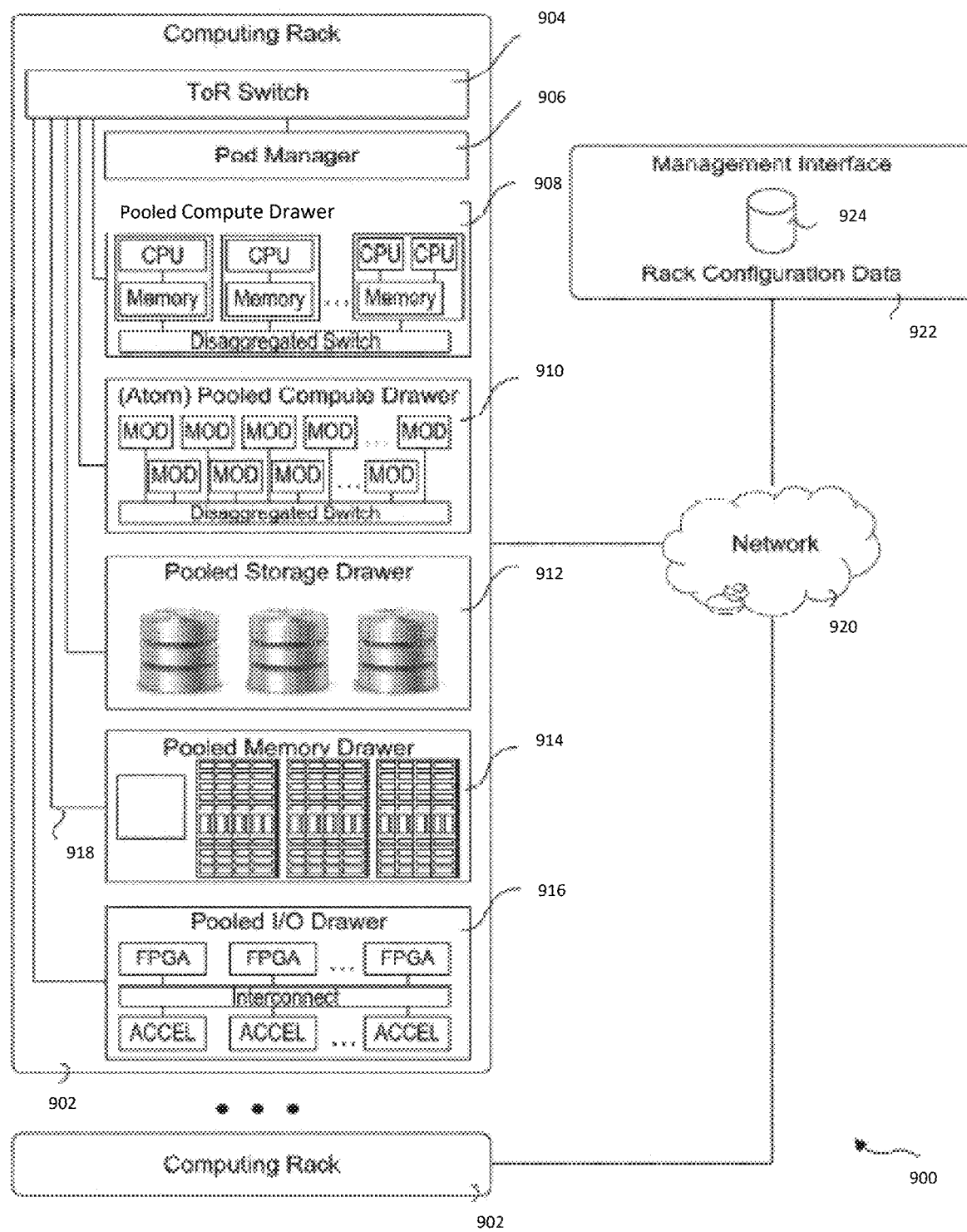

FIGS. 4*a*, 4*b*, 4*c* and 4*d* pertain to a first ruler SSD cooling embodiment;

FIG. 5 pertains to a second ruler SSD cooling embodiment;

FIGS. 6*a*, 6*b*, 6*c* and 6*d* pertain to a third ruler SSD cooling embodiment;

FIG. 7 shows a computing system;
FIG. 8 shows a data center;
FIG. 9 shows a populated rack.

DETAILED DESCRIPTION

Figure 1:
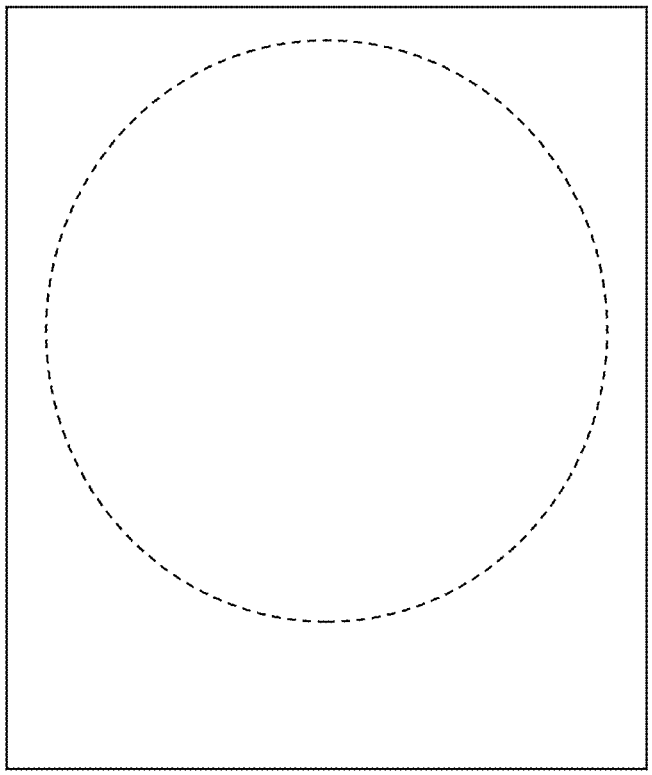

Traditionally, non-volatile mass storage devices have been implemented as hard disk drives (HDDs). In the case of an HDD, one or more rotating disks coated with magnetic storage material are used to store information. In order to house the disk(s), referring to FIG. 1, the form factor for an HDD, such as a 2.5 inch drives, are square-like. Over the past decade or so, solid state drives (SSDs) have made significant inroads as replacements for HDDs. SSDs are non-volatile mass storage devices that use non-volatile memory chips (e.g., flash memory chips), rather than rotating disk(s), as the underlying storage technology.

Because SSDs started out as replacements for HDDs, initial SSD solutions were packaged in the same form factor as HDDs (e.g., U.2 form factor SSDs). However, the square-like form factor is inefficient in terms of maximizing the amount of non-volatile storage that can be packed in a system (assuming the non-volatile storage is to be implemented with semiconductor chips and not disk drives).

Figure 2:
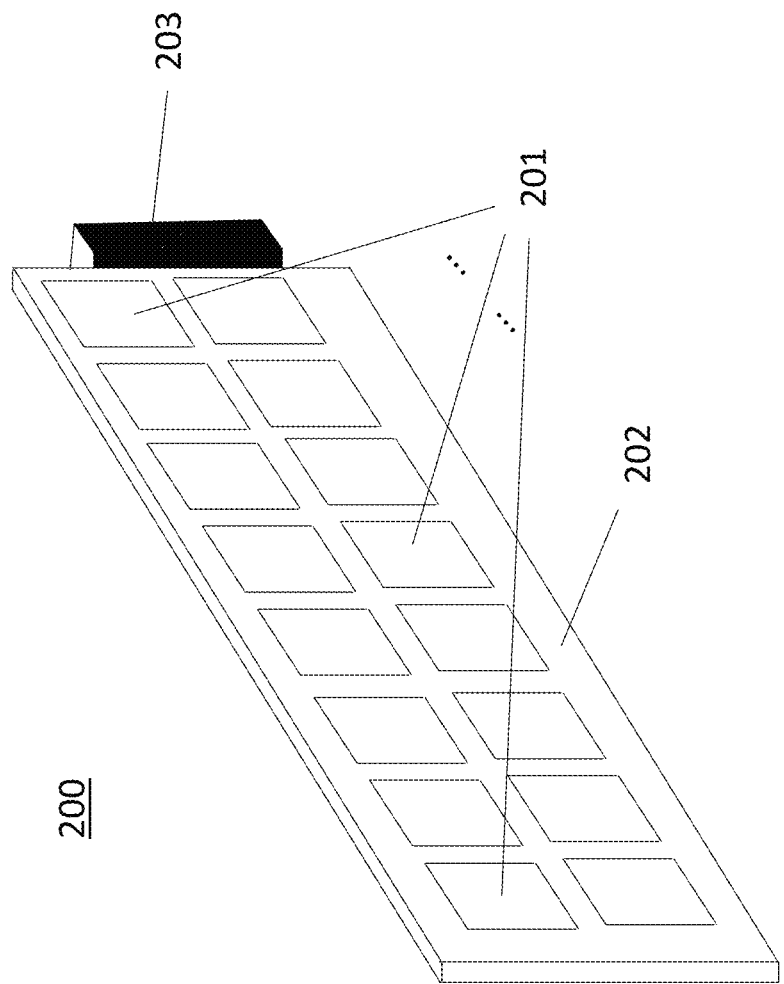
FIG. 2 shows a solid state drive (SDD) having a ruler form factor.

FIG. 2 shows a more recent SSD form factor approach that is being promulgated by the Enterprise and Data Center Form Factor (EDSFF) Working Group. As observed in FIG. 2, according to the EDSFF approach, an SSD is packaged in the shape of a "ruler". A ruler 200 consists of a number of semiconductor chips 201 mounted to a printed circuit board 202 and an electrical connector 203 that is mounted at a far edge of the printed circuit board 202. The semiconductor chips are disposed along the long, run length of the ruler. The thickness of the ruler largely corresponds to the height of the chip packages and the thickness of the printed circuit board they are mounted to.

The form factor shape of a ruler includes a length that is at least 1.8 times its width. For example, EDSFF ruler form factors include dimensions of 38.4 mm×318.75 mm ("ELL") or 76 mm×142.2 mm ("E3.L"). A number of Next Generation Form Factor (NGFF) solutions, also known as "M2", also offer a ruler shaped form factor (e.g., 22 m×80 mm and 22 mm×110 mm).

Consistent with the concept of a ruler, a mass storage device embodied in a ruler form factor has a relatively thin height or thickness as compared to the dimensions of its width and length (e.g., thickness is less than half of the ruler's smallest width/length dimension). For example, EDSFF ruler solutions have thicknesses of only 7.5 mm and 16.8 mm while M2 ruler solutions have thicknesses of only 1.3 mm, 2.23 mm and 3.88 mm).

Here, the small thicknesses of ruler solutions allow large numbers of rulers to be closely packed "side-by-side" in a computing system such as a sled server or other rack mountable computer, computing component or networking system.

Figure 3:
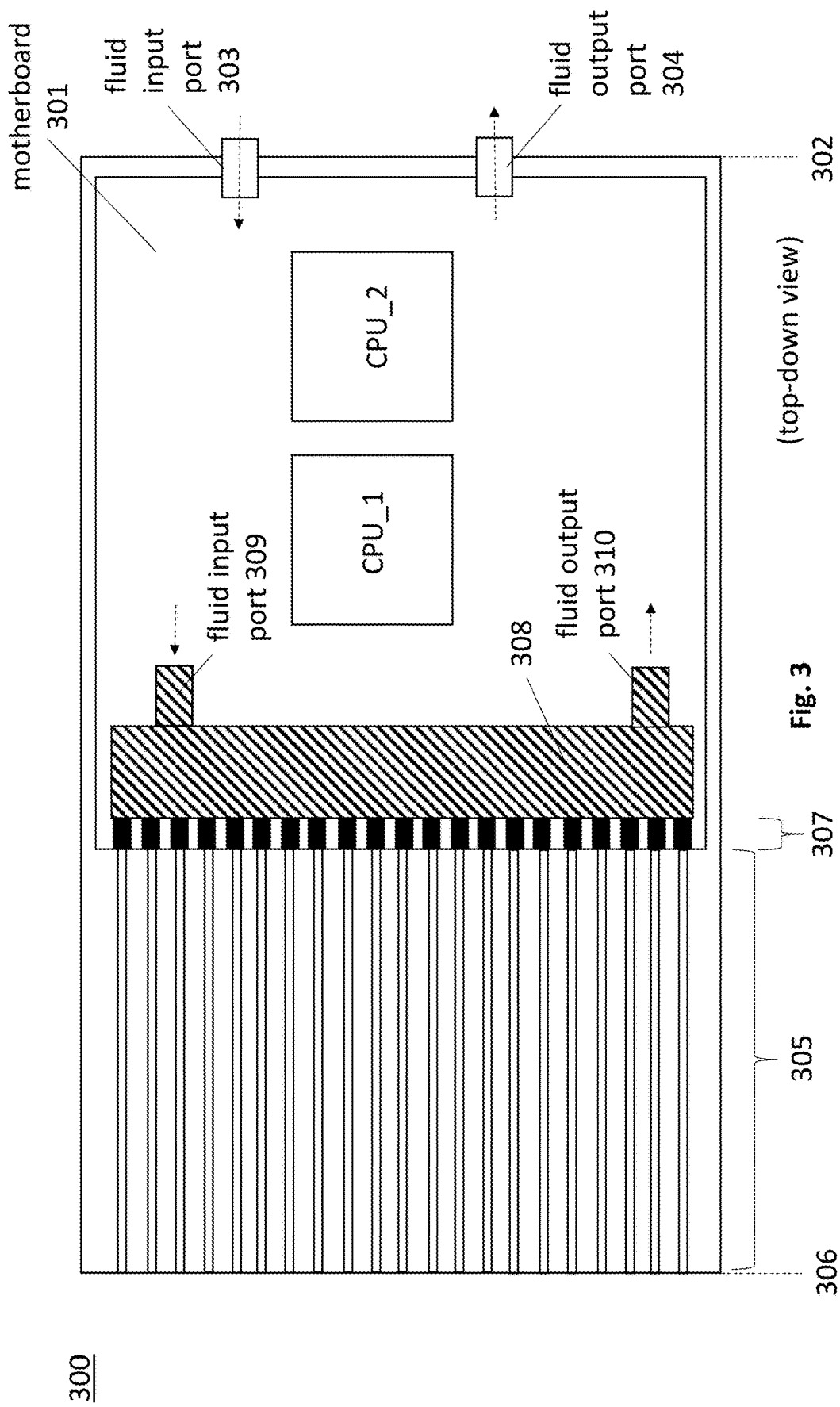
FIG. 3 shows a top down view of a mechanical design for a rack mountable component.

With large numbers of rulers being tightly packed into a system there is little head room between rulers. As such, the cooling of the chips on the rulers can be a challenge, FIG. 3 shows a top down view of a mechanical design for an electronic system 300 such as rack mountable server (blade server). Here, a motherboard 301 containing, e.g., one or more processor chips is disposed in the server chassis. At its back face 302, the chassis has an electrical and mechanical interface that mounts to a rack (for ease of drawing these interfaces are not depicted in FIG. 3). The mechanical interface to the rack securely mounts the server to the rack. The electrical interface to the rack transports electrical signals between the server and the rack. The rack (also not depicted in FIG. 3) contains internal wiring to, e.g., communicatively couple multiple servers within the rack and/or one or more network gateways, e.g., to other racks.

The mechanical interface to the rack also includes ports 303, 304 for liquid ingress/egress. Here, the rack includes (or is otherwise coupled to) a heat exchanger (or some other mechanical apparatus) that converts liquid that has been warmed by the rack's electronic equipment into cooled liquid. The cooled liquid is routed through the rack and back into the equipment. Here, such cooled liquid will enter the server 300 through input port 303. The liquid is routed through the server through various pipes/tubes (not depicted in FIG. 3) and is warmed by the heat generated by the server's semiconductor chips and voltage regulators. The warmed fluid is then routed/piped to the server's exit port 304. From the exit port 304, the warmed fluid is directed to the heat exchanger, cooled, and the process repeats.

Certain aspects of the cooling can also be under the control of a controller that is wholly or partially within the electronic system and/or within another electronic system that is mechanically and/or electrically integrated with the rack and/or coupled to the rack. For example, the pumping activity of one or more pumps that pump the fluid through the cooling system may be varied by a controller in view of one or more detected temperature readings that are provided to the controller.

The SSD rulers 305 are entered through the front face 306 of the rack and plug into corresponding sockets 307 or other kinds of electrical I/O receptacles that are mounted to the server's mother board 301. Here, a user can establish the capacity of the server's non-volatile mass storage by plugging a corresponding number of rulers into the server. As can be seen in FIG. 3, when multiple rulers 305 are plugged side-by-side into their corresponding receptacles 307, there is minimal clearance between rulers. As a consequence, the temperature of the space between rulers can quickly reach high temperatures (owing to the many semiconductor chips that dissipate heat into the space). Moreover, it is difficult to insert an effective cooling solution into the space given how small the space is.

FIGS. 4a through 4d shows a cost effective solution that efficiently removes heat from the SSD rulers, even if they are narrowly spaced apart. As observed in FIG. 4a, before being plugged into the server, a cold plate 401 is mounted to the ruler 402. Here, the ruler can be viewed as an electronic circuit board 403 with multiple packaged semiconductor chips 404 attached thereto. In the embodiment depicted in FIG. 4a, the cold plate 401 is mounted to the circuit board 403 but also makes physical contact with the package lids of the semiconductor chips 404. Here, by forming the cold plate so that a respectable percentage of the surface area of each lid (e.g., at least 25%) makes contact with the cold plate, heat from each semiconductor chip will be efficiently transferred from the package lid to the cold plate 401.

Figure 4A:
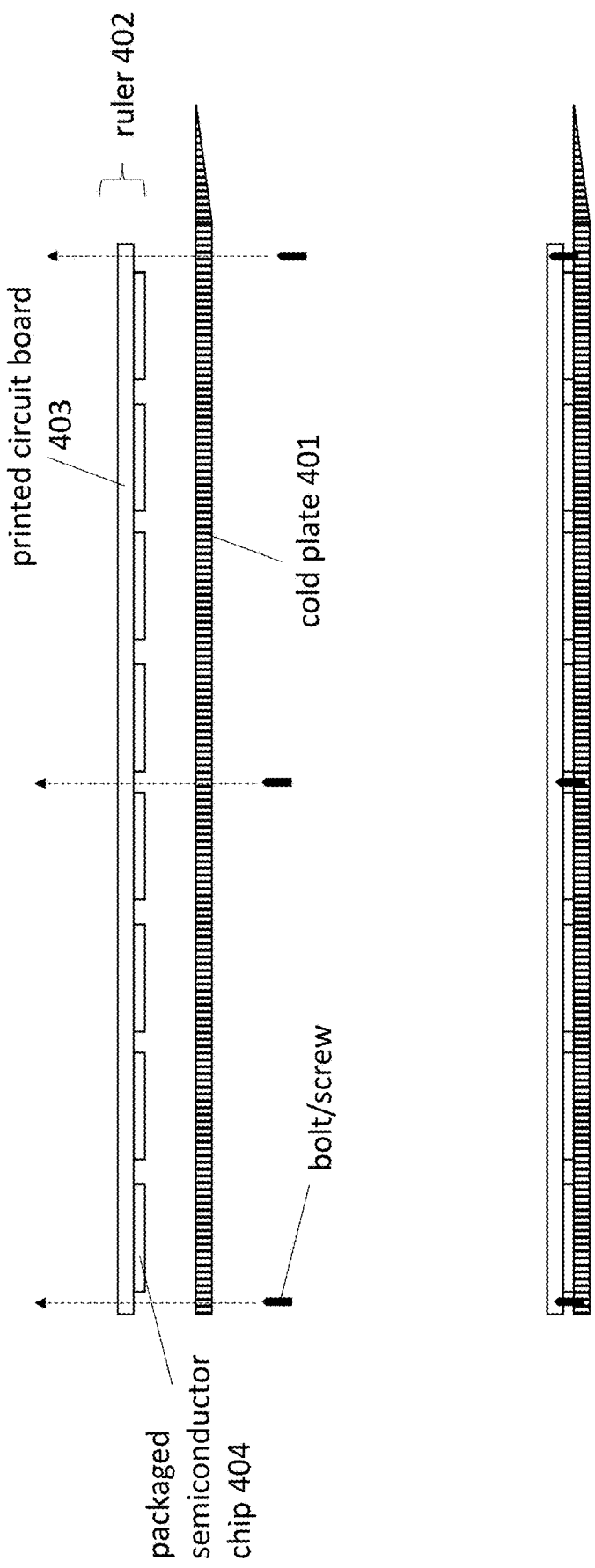
Figure 4B:
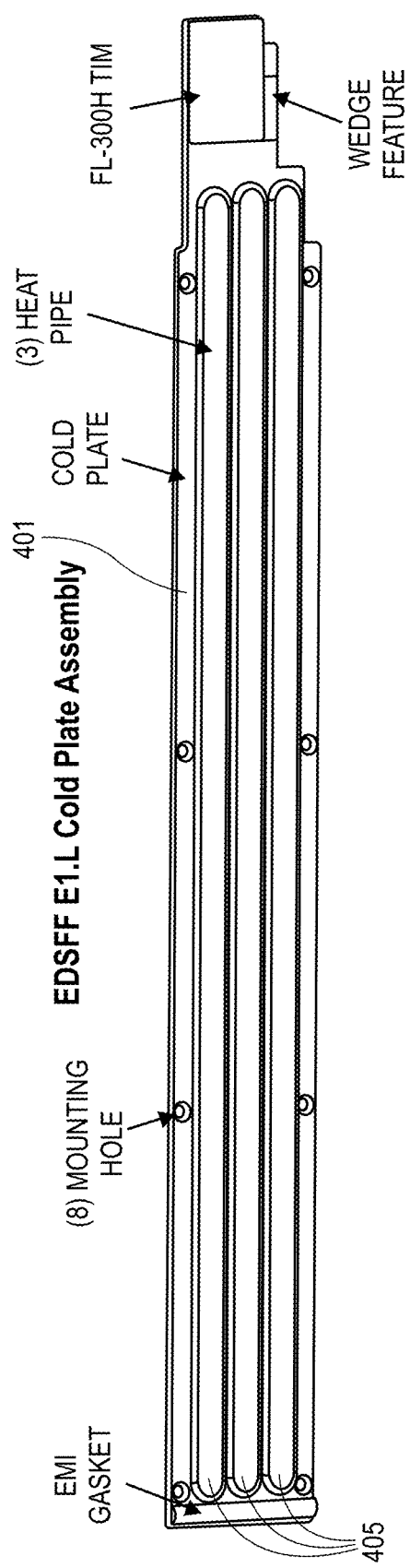

FIG. 4b shows a more detailed view of an embodiment of the cold plate 401. In the embodiment of FIG. 4b, the cold plate 401 is shaped to include heat pipes 405 that transport heat along the length of the cold plate.

In various embodiments the SSD ruler is single sided in which case chips and a cold plate are mounted on only one side of the ruler printed circuit board. In yet other embodiments the SSD ruler is dual sided in which case chips and a cold plate are mounted on both sides of the ruler printed circuit board.

Regardless, referring back to FIG. 3, note that the server's liquid cooling system includes a "block" 308 that is mounted to the server chassis and/or motherboard 301 and is mechanically integrated with the receptacles 307 that receive the rulers 302. Here, the block 308 receives liquid at a liquid input port 309. The liquid runs through a fluidic channel formed within the block (not depicted in FIG. 3) and exits the block 308 from the block's liquid exit port 310. Again, other cooling system piping that exists within the server is not shown in FIG. 3 for ease of drawing.

Figure 4C:
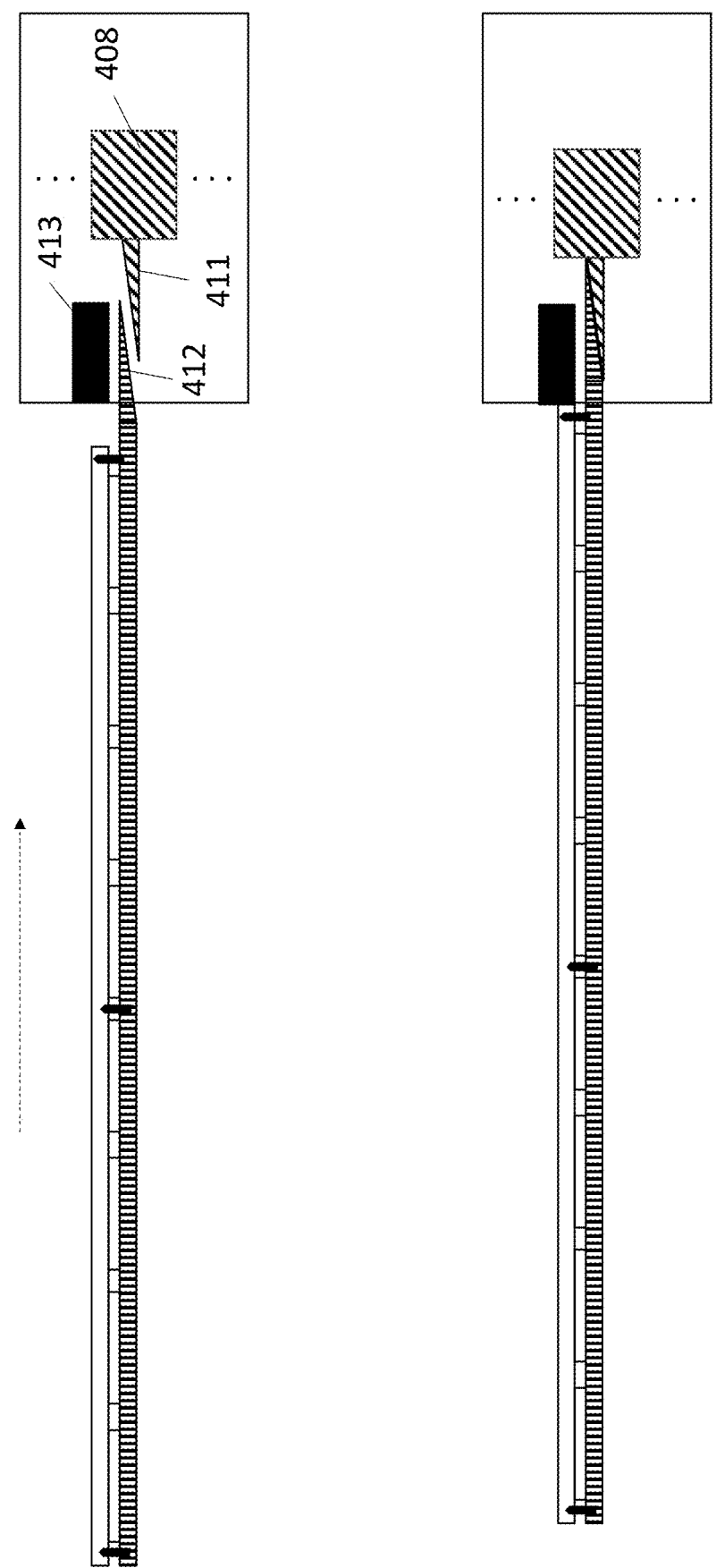

Importantly, as observed in FIG. 4c, a wedge 411 extends from the block 408 and mechanically interfaces with a corresponding wedge 412 that is formed at the end of the cold plate. FIG. 4c depicts a ruler with cold plate being plugged into the system. Here, in plugging the ruler into the system, the ruler makes electrical connection to the server I/O receptacle 413 (for ease of drawing the ruler's corresponding connector is not shown) and the ruler's wedge 412 makes mechanical contact with the block's wedge 411.

With the cold plate, the block and the wedges being composed of thermally conductive material (e.g., a metal such as copper, aluminum, etc.), and with the wedges having substantial surface area contact between them, highly efficient heat transfer exists from the cold plate to the block. With efficient heat transfer from the chips to the cold plate, heat is therefore efficiently transferred from the ruler's chips to the block 408. The fluid that runs through the block then carries away the heat from the block and ultimately exits the server. In various embodiments, there is thermally conductive interface material (e.g., paste, double-sided stick tape) between the wedges to enhance thermal transfer between the two.

Figure 4D:
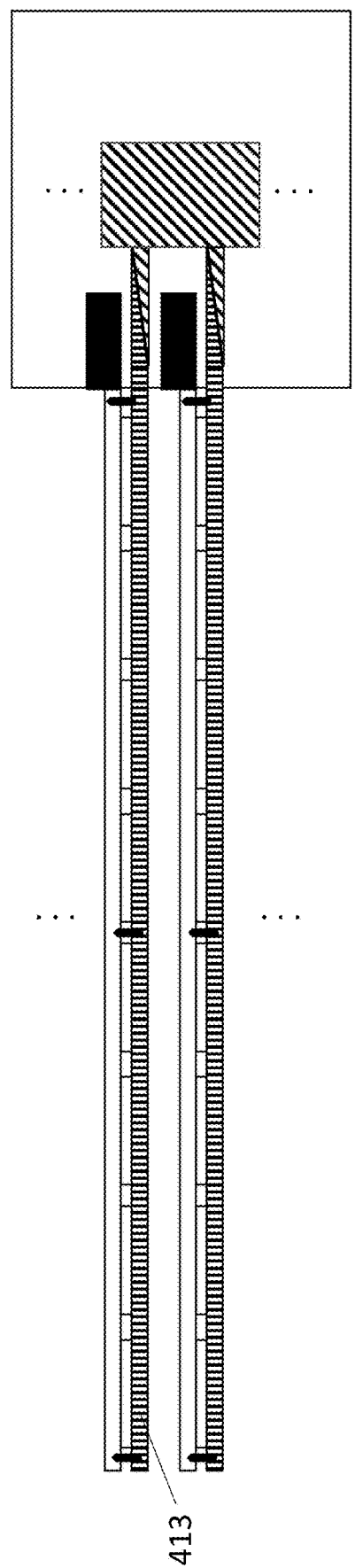

FIG. 4d shows the ruler plugged into the server when a neighboring ruler is also plugged into the server. Here, with the cold plate 413 having a relatively thin vertical profile, the cold plate easily fits in the space between the two rulers.

FIG. 5 shows an alternative cold plate embodiment. According to the embodiment of FIG. 5, the cold plate has two wedges. That is, a first wedge 521 extends from the cold plate, similar to the embodiment described above with respect to FIGS. a-d. Additionally, a second wedge 522 extends from the cold plate alongside the first wedge. The pair of wedges 521, 522 doubles the surface area of contact between the cold plate and the block thereby further enhancing the efficiency of heat transfer from the cold plate to the block. In order to properly mate to such a ruler, the block should be designed with two wedges per ruler receptacle.

Although the embodiments above have stressed the use of wedge interfacing between the cold plate and the block, it is pertinent to point out that any shape having a "ramped" or "linearly advancing" interface may be used. Here, the ramping/linearly advancing nature of the interface between the cold plate and the block essentially increases the surface area of contact between the two components and therefore acts to enhance the thermal conductivity between them. Additionally, such ramping/linearly advancing interfacing also delays the shearing effect of the two surfaces sliding past each other to the last moments of contact to reduce those shear forces that must be overcome during insertion/extraction.

Therefore, other shapes besides a wedge (e.g., triangular, ovular tilted contact pads, etc.) yet still possessing some kind of ramping/linearly advancing interface are part by the instant teachings. The direction of linear advancement in the depicted embodiments is along the long axis of the ruler but, conceivably, could also be along the short axis of the ruler. Moreover, the linear/ramped advancement need not exist on the entire interface (e.g., the tips/ends of the interfacing structures may be rounded or curved to act as a hard stop of the insertion of one into the other).

FIGS. 6a through 6d show another design for a ruler cold plate. As observed in FIG. 6a, the cold plate 600 has a fluid channel 601 that runs along the cold plate's periphery. A fluid input port 602 exists on one end the fluid channel and a fluid exit port 603 exists on the other end of the fluid channel.

Figure 6A:
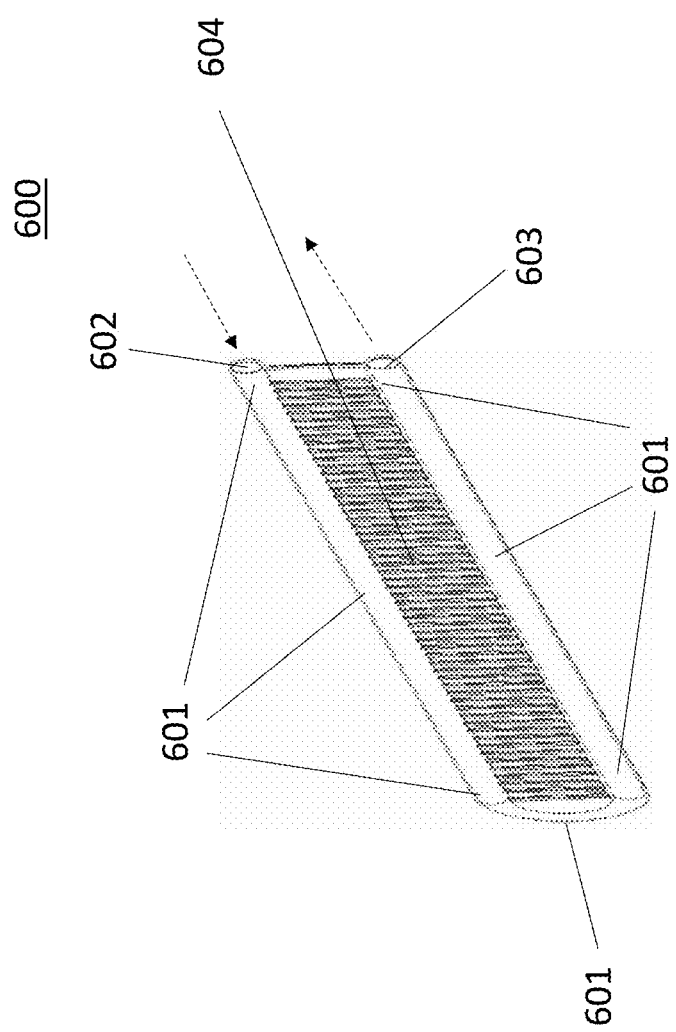

As observed in FIG. 6b, which depicts a side view, the cold plate 600 plugs into a fluid exit port 621 of the block 608 and fluid entrance port 622 of the block 608. That is, unlike the approach described above with respect to FIGS. 4a-4d, in the approach of FIGS. 6a and 6b, the cold plate 600 mounts to the block 608 rather than the ruler. Here, according to one approach, the cold plate's input port 619 acts as a sleeve that slips over an exit port nozzle 621 that emanates from the block 608. The sleeve can have a freely rotating nut 620 that is threaded and tightened against threads that are formed around the nozzle 621. Contra-wise, the cold plate 600 has an exit port nozzle 624 that is inserted into a fluid entrance part sleeve 622 of the block 608, The fluid entrance port sleeve 622 has a freely rotating nut 623 that is threaded and tightened against threads that are formed around the nozzle 624. Other attachment approaches are also possible.

In an embodiment, the block is designed as a manifold that can run fluid through multiple cold plates that are attached to the block. The fluid input/exit ports of the block are aligned to place the cold plates in the spaces between the rulers. If fewer rulers than maximum capacity are installed, the block's fluid exit/input ports are capped off.

Figure 6C:
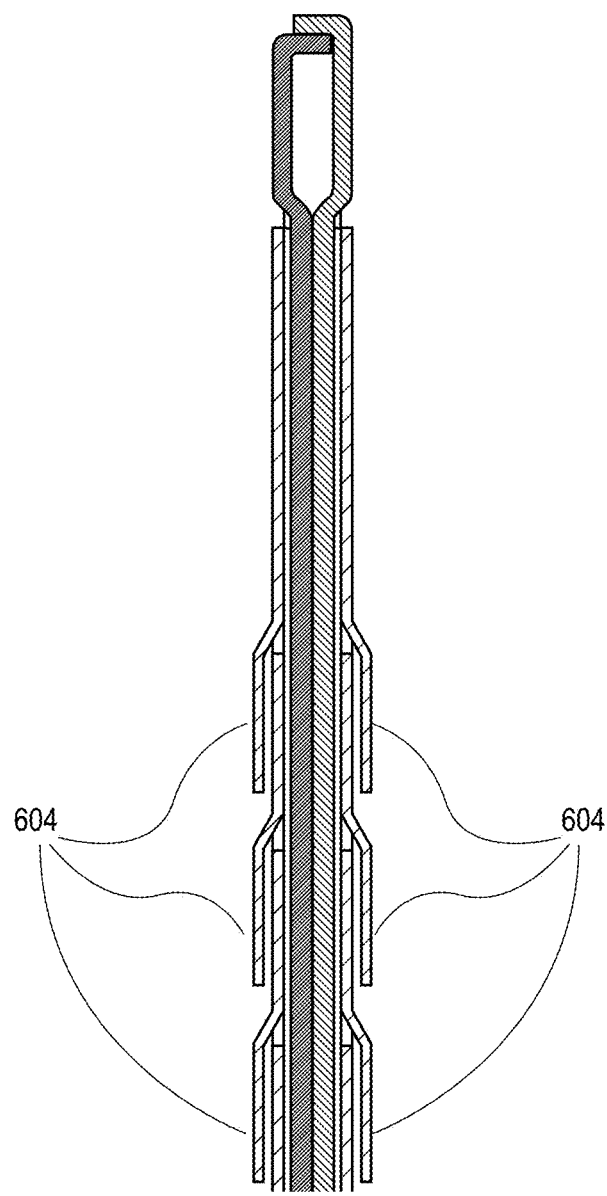

Importantly, referring to both FIG. 6a and FIG. 6c, fingers 604 extend from both faces of the cold plate (FIG. 6b shows a cross section of the upper half of the cold plate). When a ruler is inserted into the chassis on either side of the cold plate, the fingers 604 make contact with the package lids of the ruler's semiconductor chips thereby forming efficient heat transfer contacts between the chips and the cold plate. The fingers 604 may be positioned (or even tabbed out) so that they are compressed when the ruler is inserted thereby providing a spring-like force to the chip package lids to ensure tight contact with the lids and corresponding high thermal transport efficiency between the chip package and cold plate. As depicted, the fingers 604 point along the vertical axis to maximize contact with the chip lids. In an alternate approach, the fingers point inward toward the block so that a ruler's chips will slide easily over them as the ruler is being installed into the chassis, According to the embodiment of FIGS. 6a-6c, heat from the chips flows into the fingers and is transported away by the fluid flow that runs through the cold plate. In the case of dual sided rulers, a cold plate can be inserted between every neighboring pair of rulers. In the case of single sided rulers, the cold plate can have fingers on only one face of the cold plate and be inserted in every space between rulers, or, can have fingers on both faces and be inserted between every other space that exists between rulers.

Figure 6D:
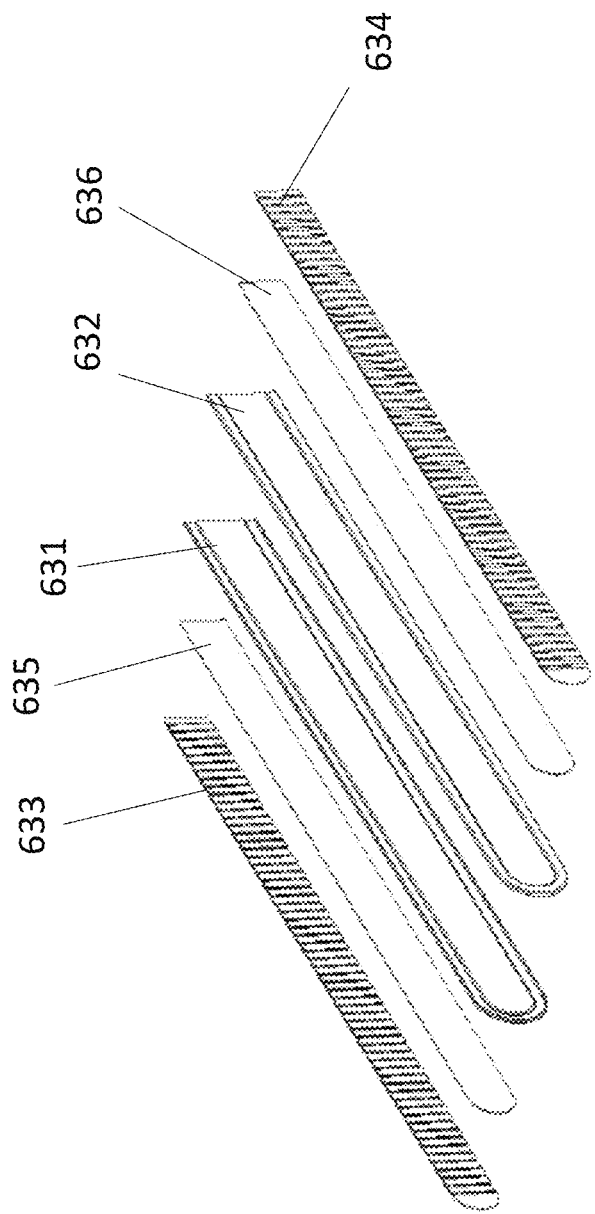

FIG. 6d shows an exploded view of the different parts of the cold plate. Here two inner plates 631, 632 are pressed flush against one another. Each inner plate forms half of the fluid channel so that, when the two inner plates are pressed against one another, a complete fluid channel is formed. Alternatively or in combination, the two halves can be brazed and/or glued together to form a tight liquid-proof seal. Outer finger arrays 633, 634 are then attached to each respective inner plate with, e.g., thermally conductive double-side stick tape 635, 636 to form the completed cold plate.

It is conceivable that the embodiments described above with respect to FIGS. 4a-d and 5 and 6a-6d can be combined into a single solution. For example, the cold plate described above with respect to FIGS. 4a-d and 5 may include the fingers of the solution of FIGS. 6a-6d, e.g., to act as a counter-spring to the screw mounting of the cold plate to the circuit board, or, may instead be mounted to the cooling component (rather than the ruler circuit board) to additionally receive a flow of liquid coolant in combination with wedge thermal interfacing to the block. Likewise, the cold plate of FIGS. 6a-6d may be enhanced to include wedge interfacing to the block to enhance thermal coupling between the cold plate and the block.

Although embodiments above have stressed SSDs with ruler form factors, it is conceivable that pluggable components other than SSDs may poses a ruler form factor and make use of the teachings described above. In particular, emerging non-volatile memory technologies, such as Optane™ memory from Intel Corporation or QuantX memory from Micron corporation, are capable of byte addressability and/or have read and/or write access times that are comparable with dynamic random access memory (DRAM) or are otherwise significantly faster than flash memory. As a consequence, such emerging non-volatile memory is being used for true memory purposes (e.g., main memory) rather than mass storage purposes.

Moreover, functions completely other than storage/memory may be pluggable into a system and therefore can entertain the use of a ruler form factor and therefore the cooling techniques described above. Examples include accelerators (e.g., graphics processing unit (GPU), neural network, etc.) and network interface adaptors to name just a few.

Although embodiments above have stressed a server system having one or more processors (CPUs), it is pertinent to point out that any, e.g., high density large scale semiconductor chip could be disposed on a motherboard (e.g., system-on-chip, accelerator chip (e.g., neural network processor), graphics processing unit (GPU), general purpose graphics processing unit (GPGPU), field programmable gate array (FPGA), application specific integrated circuit (ASIC)), an "X" processing unit ("XPU") where "X" can be any processor other than a general purpose processor (e.g., etc. G for graphics, D for data, I for infrastructure, etc.), etc.

Any chassis discussed above can have dimensions that are compatible with an industry standard rack (such as racks having 19" or 23" widthwise openings and having mounting holes for chassis having heights of specific height units (e.g., 1 U, 2 U, 3 U where U=1.75"). One examples is the IEC 60297 Mechanical structures for electronic equipment—Dimensions of mechanical structures of the 482.6 mm (19 in) series. Generally, however, a chassis of any dimension is possible.

The electrical I/Os of the ruler to motherboard connections described above (or input/output interfaces between the rack and chassis described above) may be compatible with or used to transport signals associated with various data center computing and networking system interconnect technologies. Examples include, e.g., data and/or clocking signals associated with any of Infinity Fabric (e.g., as associated and/or implemented with AMD products) or derivatives thereof, specifications developed by the Cache Coherent Interconnect for Accelerators (CCIX) consortium or derivatives thereof, specifications developed by the GEN-Z consortium or derivatives thereof, specifications developed by the Coherent Accelerator Processor Interface (CAPI) or derivatives thereof, specifications developed by the Compute Express Link (CXL) consortium or derivatives thereof, specifications developed by the Hyper Transport consortium or derivative thereof, Ethernet, Infiniband, NVMe-oF, PCIe, etc.

The chassis described above may contain the primary components of an entire computer system (e.g., CPU, main memory controller, main memory, peripheral controller and mass non-volatile storage), or, may contain the functionality of just some subset of an entire computer system (e.g., a chassis that contains primarily CPU processor power, a chassis that contains primarily main memory control and main memory, a chassis that contains primarily a storage controller and storage). The later can be particularly useful for dis-aggregated computing systems.

In the case of a dis-aggregated computer system, unlike a traditional computer in which the core components of a computing system (e.g., CPU processors, memory, storage, accelerators, etc.) are all housed within a common chassis and connected to a common motherboard, such components are instead integrated on separate pluggable cards or other pluggable components (e.g., a CPU card, a system memory card, a storage card, an accelerator card, etc.) that plug-into a larger exposed backplane or network instead of a same, confined motherboard. As such, for instance, CPU computer power can be added by adding CPU cards to the backplane or network, system memory can be added by adding memory cards to the backplane or network, etc. Such systems can exhibit even more high speed card to card connections than traditional computers. One or more dis-aggregated computers and/or traditional computers/servers can be identified as a Point of Delivery (PoD) for computing system function in, e.g., the larger configuration of an information technology (IT) implementation such as a data center.

FIG. 7 depicts an example system. The system can use embodiments described herein to determine a reference voltage to apply to a rank of memory devices and a timing delay of a chip select (CS) signal sent to the rank of memory devices. System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 700 includes interface 712 coupled to processor 710, which can represent a higher speed interface or a high throughput interface for system components that need higher bandwidth connections, such as memory subsystem 720 or graphics interface components 740, or accelerators 742. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Accelerators 742 can be a fixed function offload engine that can be accessed or used by a processor 710. For example, an accelerator among accelerators 742 can provide compression (DC) capability, cryptography services such as public key encryption (PKE), cipher, hash/authentication capabilities, decryption, or other capabilities or services. In some embodiments, in addition or alternatively, an accelerator among accelerators 742 provides field select controller capabilities as described herein. In some cases, accelerators 742 can be integrated into a CPU socket (e.g., a connector to a motherboard or circuit board that includes a CPU and provides an electrical interface with the CPU). For example, accelerators 742 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 742 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, volatile memory, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 700 includes interface 714, which can be coupled to interface 712. In one example, interface 714 represents an interface circuit, which can include stand-alone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can transmit data to a remote device, which can include sending data stored in memory. Network interface 750 can receive data from a remote device, which can include storing received data into memory. Various embodiments can be used in connection with network interface 750, processor 710, and memory subsystem 720.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (e.g., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (e.g., the value or state of the data is indeterminate if power is interrupted to system 700). In one example, storage subsystem 780 includes controller 782 to interface with storage 784. In one example controller 782 is a physical part of interface 714 or processor 710 or can include circuits or logic in both processor 710 and interface 714.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 700. More specifically, power source typically interfaces to one or multiple power supplies in system 700 to provide power to the components of system 700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 700 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

FIG. 8 depicts an example of a data center. Various embodiments can be used in or with the data center of FIG. 8. As shown in FIG. 8, data center 800 may include an optical fabric 812. Optical fabric 812 may generally include a combination of optical signaling media (such as optical cabling) and optical switching infrastructure via which any particular sled in data center 800 can send signals to (and receive signals from) the other sleds in data center 800. However, optical, wireless, and/or electrical signals can be transmitted using fabric 812. The signaling connectivity that optical fabric 812 provides to any given sled may include connectivity both to other sleds in a same rack and sleds in other racks. Data center 800 includes four racks 802A to 802D and racks 802A to 802D house respective pairs of sleds 804A-1 and 804A-2, 804B-1 and 804B-2, 804C-1 and 804C-2, and 804D-1 and 804D-2. Thus, in this example, data center 800 includes a total of eight sleds. Optical fabric 812 can provide sled signaling connectivity with one or more of the seven other sleds. For example, via optical fabric 812, sled 804A-1 in rack 802A may possess signaling connectivity with sled 804A-2 in rack 802A, as well as the six other sleds 804B-1, 804B-2, 804C-1, 804C-2, 804D-1, and 804D-2 that are distributed among the other racks 802B, 802C, and 802D of data center 800. The embodiments are not limited to this example. For example, fabric 812 can provide optical and/or electrical signaling.

FIG. 9 depicts an environment 900 includes multiple computing racks 902, each including a Top of Rack (ToR) switch 904, a pod manager 906, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 908, and INTEL® ATOM™ pooled compute drawer 210, a pooled storage drawer 212, a pooled memory drawer 214, and an pooled I/O drawer 916. Each of the pooled system drawers is connected to ToR switch 904 via a high-speed link 918, such as a 40 Gigabit/second (Gb/s) or 100 Gb/s Ethernet link or an 100+Gb/s Silicon Photonics (SiPh) optical link. In one embodiment high-speed link 918 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 902 may be interconnected via their ToR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations.

Rack Scale Design (RSD) environment 900 further includes a management interface 922 that is used to manage various aspects of the RSD environment. This includes managing rack configuration, with corresponding parameters stored as rack configuration data 924.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a cold plate, the cold plate to receive heat from semiconductor chips of a first electronic component and a second electronic component that is to be plugged into an electronic system; and
first fingers on a first face of the cold plate to make spring-force thermal contact with package lids of semiconductor chips of the first electronic component and second fingers on a second face of the cold plate to make spring-force thermal contact with package lids of semiconductor chips of the second electronic component, wherein the first and second fingers have a cantilever structure, wherein a first region of a finger of the first fingers is raised relative to a second region of the finger wherein the second region makes physical contact with the cold plate, and wherein the first region is to make thermal contact with one or more of the package lids of the semiconductor chips of the first electronic component; and
a fluidic channel, the fluidic channel having a cooled fluid input channel and a warmed fluid output channel that emanate from the cold plate, wherein ends of the fluidic channel are to face fluidic connectors of the electronic system that the cooled fluid input and warmed fluid output channels are to respectively couple to, wherein one of the cooled fluid input channel and the warmed fluid output channel comprises a first threaded region capable of engaging with a first rotating nut of the fluidic connectors of the electronic system, and wherein another of the cooled fluid input channel and the warmed fluid output channel comprises a second rotating nut capable of engaging with a second threaded region of the fluidic connectors of the electronic system.

2. The apparatus of claim 1 wherein the cold plate is mounted to the fluidic connectors of the electronic system.

3. The apparatus of claim 1 wherein the first electronic component is a solid state drive.

4. The apparatus of claim 1 wherein the cold plate comprises a first half and a second half, wherein the first half has one half of the fluidic channel and the second half has another half of the fluidic channel, and wherein the first half and the second half are sealed together to form the fluidic channel.

5. An electronic system, comprising:
an interface to a rack, the interface to the rack comprising liquid ports to receive/send liquid from/to the rack;
a motherboard;
electronic receptacles to receive corresponding electronic connectors of a plurality of electronic components;
a cold plate, the cold plate to receive heat from a first electronic component of the plurality of electronic components, wherein the cold plate is to be located between the first electronic component of the plurality of electronic components and a second electronic component of the plurality of electronic components;
first fingers on a first face of the cold plate that make spring-force thermal contact with package lids of semiconductor chips of the first electronic component of the plurality of electronic components wherein the first fingers have a cantilever structure, wherein a first region of a finger of the first fingers is raised relative to a second region of the finger, wherein the second region makes physical contact with the cold plate, and wherein the first region makes thermal contact with one or more of the package lids of semiconductor chips of the first electronic component of the plurality of electronic components; and
a liquid cooling component, the liquid cooling component comprising: an interface to the cold plate that places the cold plate between the first electronic component of the plurality of electronic components and the second electronic component of the plurality of electronic components wherein the interface to the cold plate includes fluidic connectors that are to couple to a cooled fluid input channel and a warmed fluid output channel that emanate from the cold plate, wherein one of the cooled fluid input channel and the warmed fluid output channel comprises a first threaded region capable of engaging with a first rotating nut of the interface of the liquid cooling component, and wherein another of the cooled fluid input channel and the warmed fluid output channel comprises a second rotating nut capable of engaging with a second threaded region of the interface of the liquid cooling component.

6. The electronic system of claim 5 wherein the cold plate is mounted to fluidic connectors of the liquid cooling component.

7. The electronic system of claim 5 wherein the plurality of electronic components are solid state drives.

8. The electronic system of claim 5 wherein the liquid cooling component further comprises fluidic channels.

9. The electronic system of claim 5 wherein the motherboard comprises a processor semiconductor chip.

10. The apparatus of claim 5 wherein the cold plate comprises a first half and a second half, wherein the first half comprises one half of a fluidic channel and the second half comprises another half of the fluidic channel, and wherein the first half and the second half are sealed together to form the fluidic channel.

11. A data center, comprising:
multiple racks mounted with multiple electronic systems that are at least partially interconnected with optical communication channels, wherein, the multiple racks comprise a rack mounted with electronic systems of the multiple electronic systems and liquid running to/from the electronic systems of the multiple electronic systems under the control of a controller, wherein, at least one of the electronic systems of the multiple electronic systems comprises:
an interface to the rack, the interface comprising liquid ports to receive/send at least a portion of the liquid from/to the rack;
a motherboard;
electronic receptacles to receive corresponding electronic connectors of a plurality of electronic components;
a cold plate, the cold plate to receive heat from a first electronic component of the plurality of electronic components, wherein the cold plate is located between the first electronic component and a second electronic component of the plurality of electronic components;
first fingers on a first face of the cold plate that make spring-force thermal contact with semiconductor chips of the first electronic component, wherein the first fingers have a cantilever structure, wherein a first region of a finger of the first fingers is raised relative to a second region of the finger, and wherein the second region makes physical contact with the cold plate; and
a liquid cooling component, the liquid cooling component comprising: an interface to the cold plate that places the cold plate between the first electronic component of the plurality of electronic components and the second electronic component of the plurality of electronic components wherein the liquid cooling component includes channels for fluid flow, wherein the liquid cooling component includes fluidic connectors that are coupled to a cooled fluid input channel and a warmed fluid output channel that emanate from the cold plate, and wherein the liquid cooling component is fluidically coupled to the liquid ports, wherein one of the cooled fluid input channel and the warmed fluid output channel comprises a first threaded region capable of engaging with a first rotating nut of the interface of the liquid cooling component, and wherein another of the cooled fluid input channel and the warmed fluid output channel comprises a second rotating nut capable of engaging with a second threaded region of the interface of the liquid cooling component.

12. The data center of claim 11 wherein the plurality of electronic components are solid state drives.

13. The apparatus of claim 11 wherein the cold plate comprises a first half and a second half, wherein the first half comprises one half of a fluidic channel and the second half comprises another half of the fluidic channel, and wherein the first half and the second half are sealed together to form the fluidic channel.

\* \* \* \* \*